United States Patent
Hussell et al.

(10) Patent No.: US 10,453,827 B1
(45) Date of Patent: Oct. 22, 2019

(54) LED APPARATUSES AND METHODS

(71) Applicant: Cree, Inc., Durham, NC (US)

(72) Inventors: Christopher P. Hussell, Cary, NC (US); Alan Wellford Dillon, Bahama, NC (US); Peter Scott Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/993,540

(22) Filed: May 30, 2018

(51) Int. Cl.
  *H01L 25/075*  (2006.01)
  *H01L 33/58*  (2010.01)
  *H01L 33/62*  (2010.01)
  *H01L 33/52*  (2010.01)

(52) U.S. Cl.
  CPC .......... *H01L 25/0753* (2013.01); *H01L 33/52* (2013.01); *H01L 33/58* (2013.01); *H01L 33/62* (2013.01); *H01L 2933/005* (2013.01); *H01L 2933/0033* (2013.01); *H01L 2933/0058* (2013.01); *H01L 2933/0066* (2013.01)

(58) Field of Classification Search
  None
  See application file for complete search history.

(56) References Cited

U.S. PATENT DOCUMENTS

| | | |
|---|---|---|
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter, Jr. |
| 5,338,944 A | 8/1994 | Edmond et al. |
| 5,359,345 A | 10/1994 | Hunter |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |

(Continued)

FOREIGN PATENT DOCUMENTS

| | | |
|---|---|---|
| EP | 2472578 A2 | 7/2012 |
| EP | 2811517 A1 | 12/2014 |
| WO | WO 2016/161161 | 10/2016 |

OTHER PUBLICATIONS

International Search Report and Written Opinion for Application No. PCT/US2016/025346 dated Aug. 2, 2016.

(Continued)

*Primary Examiner* — Michelle Mandala
(74) *Attorney, Agent, or Firm* — Jenkins, Wilson, Taylor & Hunt, P.A.

(57) ABSTRACT

Light emitting diode (LED) devices and systems include a superstrate (e.g., a light-transmissive layer), LEDs attached to the superstrate at a die-attach layer formed thereon, and an encapsulant layer formed over and/or around the LEDs with a non-reflective or clear material. A method for producing LED devices and systems includes providing a superstrate with a die-attach layer formed thereon, attaching LEDs to the superstrate at the die-attach layer, forming conductive surfaces on a side of the LED opposite the die-attach layer, dispensing an encapsulant layer to at least partially encapsulate the LEDs, and forming one or more metal traces to electrically interconnect the conductive surfaces of at least some of the LEDs with each other.

21 Claims, 6 Drawing Sheets

(56) References Cited

U.S. PATENT DOCUMENTS

| | | |
|---|---|---|
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 6,600,175 B1 | 7/2003 | Baretz et al. |
| 6,791,119 B2 | 9/2004 | Slater, Jr. et al. |
| 6,853,010 B2 | 2/2005 | Slater, Jr. et al. |
| 6,958,497 B2 | 10/2005 | Emerson et al. |
| 7,095,056 B2 | 8/2006 | Vitta et al. |
| 7,213,940 B1 | 5/2007 | Van De Ven et al. |
| 7,456,499 B2 | 11/2008 | Loh et al. |
| 7,564,180 B2 | 7/2009 | Brandes |
| 7,655,957 B2 | 2/2010 | Loh et al. |
| 7,802,901 B2 | 9/2010 | McMillan |
| 7,821,023 B2 | 10/2010 | Yuan et al. |
| 7,952,544 B2 | 5/2011 | Roberts |
| 7,960,819 B2 | 6/2011 | Loh et al. |
| 7,999,283 B2 | 8/2011 | Chakraborty et al. |
| 8,018,135 B2 | 9/2011 | Van De Ven et al. |
| 8,044,418 B2 | 10/2011 | Loh et al. |
| 8,125,137 B2 | 2/2012 | Medendorp, Jr. et al. |
| 8,264,138 B2 | 9/2012 | Negley et al. |
| 8,337,071 B2 | 12/2012 | Negley et al. |
| 8,563,339 B2 | 10/2013 | Tarsa et al. |
| 8,729,589 B2 | 5/2014 | Hussell et al. |
| 8,866,410 B2 | 10/2014 | Negley et al. |
| 8,970,131 B2 | 3/2015 | Brandes et al. |
| 9,024,349 B2 | 5/2015 | Chitnis et al. |
| 9,054,257 B2 | 6/2015 | Chan et al. |
| 9,131,561 B2 | 9/2015 | Athalye |
| 9,159,888 B2 | 10/2015 | Chitnis et al. |
| 9,277,605 B2 | 3/2016 | Ni |
| 9,414,454 B2 | 8/2016 | Brandes et al. |
| 9,713,211 B2 | 7/2017 | Van De Ven et al. |
| 2001/0032985 A1 | 10/2001 | Bhat et al. |
| 2004/0062040 A1 | 4/2004 | Blume et al. |
| 2005/0035356 A1* | 2/2005 | Kek .................. H01L 25/167 257/81 |
| 2006/0118807 A1 | 6/2006 | Ives et al. |
| 2006/0152668 A1 | 7/2006 | Jang et al. |
| 2006/0221272 A1 | 10/2006 | Negley et al. |
| 2007/0085944 A1 | 4/2007 | Tanaka et al. |
| 2007/0104828 A1 | 5/2007 | Fornaguera |
| 2008/0258156 A1 | 10/2008 | Hata |
| 2008/0298063 A1 | 12/2008 | Hayashi |
| 2009/0050908 A1 | 2/2009 | Yuan et al. |
| 2009/0127702 A1 | 5/2009 | Dekker et al. |
| 2009/0230409 A1 | 9/2009 | Basin et al. |
| 2010/0060553 A1 | 3/2010 | Zimmerman et al. |
| 2011/0176301 A1* | 7/2011 | Liang .................. H01L 25/0753 362/231 |
| 2012/0235169 A1 | 9/2012 | Seko et al. |
| 2013/0026520 A1* | 1/2013 | Hu .................. H01L 33/505 257/98 |
| 2013/0307013 A1 | 11/2013 | Chan Bit Tie et al. |
| 2014/0346545 A1 | 11/2014 | Chan et al. |
| 2015/0049510 A1 | 2/2015 | Haiberger Luca et al. |
| 2015/0257211 A1 | 9/2015 | Johnson et al. |
| 2016/0027973 A1* | 1/2016 | Maki .................. H01L 33/62 257/99 |
| 2016/0293811 A1 | 10/2016 | Hussell et al. |
| 2017/0345866 A1 | 11/2017 | Joo et al. |
| 2018/0076368 A1 | 3/2018 | Hussell |

OTHER PUBLICATIONS

Restriction Requirement for U.S. Appl. No. 15/087,641 dated Nov. 20, 2017.

Non-Final Office Action for U.S. Appl. No. 15/087,641 dated Feb. 23, 2018.

Restriction Requirement for U.S. Appl. No. 15/676,965 dated Sep. 7, 2018.

Final Office Action for U.S. Appl. No. 15/087,641 dated Sep. 20, 2018.

Non-Final Office Action for U.S. Appl. No. 15/676,965 dated Nov. 30, 2018.

Restriction Requirement for U.S. Appl. No. 15/997,350 dated Mar. 22, 2019.

* cited by examiner

LED APPARATUSES AND METHODS

TECHNICAL FIELD

The present subject matter relates generally to light emitting devices, systems, and/or methods. More particularly, the subject matter disclosed herein relates to light emitter devices and methods for controlling light output.

BACKGROUND

Light emitting diodes or "LEDs" are solid state devices that convert electrical energy into light. LEDs can be utilized in light emitter devices or components for providing different colors and patterns of light useful in various lighting, display, and optoelectronic applications. One such application is the use of LEDs in video screens. LED video displays typically comprise arrays of red, green, and blue LEDs mounted on a single electronic device attached to a printed circuit board (PCB) that controls the output of each electronic device.

Conventional LED arrays often have a transparent encapsulant covering the individual LEDs to protect the devices and maximize the efficiency of the devices. When used in applications such as video screens, it may be additionally desirable to reduce and/or enhance the amount of reflected light. Controlling the amount of reflected light can provide benefits such as increased contrast, image sharpness, and consistent color quality across viewing angles.

Additionally, LED devices, such as video screens, continue to increase in size and density, while the size of the individual components making up these devices has been decreasing. Accordingly, the time and effort required to construct these devices has also been increasing. As such, it is desirable to improve the speed of LED component placement in these devices while maintaining desired light output features and controlling costs.

In particular, a known problem with LED arrays is color quality in the far-field. The far field can be generally defined as the intensity pattern observed from a distance much larger than the source. Individual LEDs in a grouped array may have different light output properties, which become more apparent when seen from a wide viewing angle. For example, some colors of LEDs can have wider light output cones and thus dominate the overall color tone at the extents of the viewing region, resulting in undesirable color quality. Hence, there is a continuing need for improvements to encapsulated LED arrays.

SUMMARY

LED devices and related methods having improved reliability and performance are provided and described herein. Devices, components, and methods described herein can advantageously exhibit improved processing times, ease of manufacture, and/or lower processing costs. Devices, components, and related methods described herein are well suited for a variety of applications such as personal, industrial, and commercial lighting applications including, for example, light bulbs and light fixture products and/or applications. In some aspects, devices, components, and related methods described herein can comprise improved LED manufacturing processes and/or improved optical properties including improved light output, contrast, and more consistent and uniform light emission and color. Such devices can be less expensive and more efficient.

In some aspects, an LED apparatus can be produced by preparing a light-transmissive layer; next applying a die-attach layer to the light-transmissive layer; applying a plurality of LEDs onto the die-attach layer; applying electrically conductive surfaces to the LEDs; and after applying the electrically conductive surfaces to the plurality of LEDs, applying an encapsulant layer to the LEDs.

In another aspect, an LED apparatus can have a light transmissive layer, a die attach layer disposed on the light-transmissive layer, a plurality of LEDs disposed on the die-attach layer, and an encapsulant layer disposed around and between the plurality of LEDs, where the apparatus does not include a substrate.

In yet another aspect, an LED apparatus can be a substrate-free apparatus having a light transmissive layer, a die attach layer disposed on the light-transmissive layer, a plurality of LEDs disposed on the die-attach layer such that a light-emitting surface of each LED of the plurality of LEDs is in contact with the die-attach layer, a dark or black encapsulant layer disposed around and between the LEDs, a layer of electrical traces disposed on a bottom surface of the plurality of LEDs opposite the die-attach layer, and a solder mask disposed over the layer of electrical traces.

BRIEF DESCRIPTION OF THE DRAWINGS

A full and enabling disclosure of the present subject matter is set forth more particularly in the remainder of the specification, including reference to the accompanying, example figures relating to one or more embodiments, in which.

DETAILED DESCRIPTION

Figure 1:
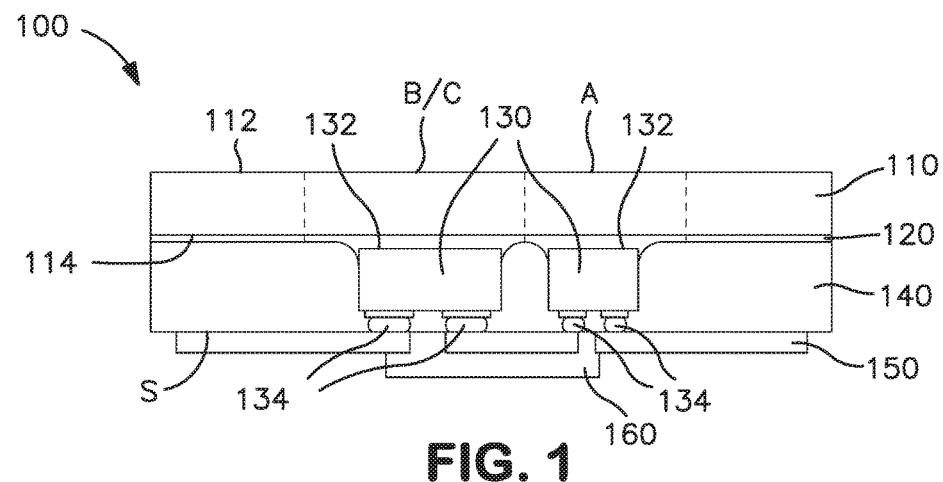
FIG. 1 is a cross-sectional side view of an LED apparatus according to the disclosure herein.

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects, scope, or embodiments set forth herein, but are to include deviations in shapes. These deviations may result, for example, from manufacturing. In the drawings, the size and relative sizes of layers and regions can be exaggerated for clarity. The actual thickness of the layers can be different from the shapes of the illustrations. A region illustrated or described as square or rectangular will typically have rounded or curved features due to normal manufacturing tolerances. Thus, the regions illustrated in the figures are schematic in nature and their shapes are not intended to illustrate the precise shape of a region of a device.

Unless the absence of one or more elements is specifically recited, the terms "comprising", "including", and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter(s)" as used herein are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common cathode configurations among mutually exclusive groups/segments/sets. The segments of LEDs can be configured in a number of different ways and may have circuits of varying functionality associated therewith (e.g. driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

The term "opaque" refers to materials, surfaces, etc. that are either not transparent or are non-light transmitting over at least a portion of the visible light spectrum. "Opaque" can also apply to the entire visible light spectrum. The term "non-light transmitting" is considered as transmitting less than 20% of a received light. A material can further be opaque due to either light absorption or light reflection. A white material, for example, can be opaque and reflective. Some materials can be opaque at certain wavelengths and transparent at others. As a non-limiting example, a red pigment may act as a color filter by absorbing light wavelengths below approximately 600 nm, where it is opaque, while transmitting light wavelengths above approximately 600 nm, where it is transparent.

Apparatuses, systems, and methods as disclosed herein can utilize red chips, green chips, and blue chips. In some aspects, chips for use in blue-shifted yellow light (BSY) devices can target different bins as set forth in Table 1 of commonly owned, assigned, and co-pending U.S. patent application Ser. No. 12/257,804, published as U.S. Pat. Pub. No. 2009/0160363, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., an LED substrate), or a sub-panel substrate. Exemplary substrates useful with lighting apparatuses as described herein can for example comprise printed circuit boards (PCBs) and/or related components (e.g., including but not limited to metal core printed circuit boards (MCPCBs), flexible circuit boards, dielectric laminates, ceramic based substrates, and the like), ceramic or metal boards having FR4 and/or electrical traces arranged on one or multiple surfaces thereof, high reflectivity ceramics (e.g., alumina) support panels, transparent or light-transmitting materials (e.g., glass, plastic, sapphire), and/or mounting elements of various materials and conformations arranged to receive, support, and/or conduct electrical power to solid state emitters. Electrical traces described herein provide electrical power to the emitters for electrically activating and illuminating the emitters. Electrical traces may be opaque or transparent, and/or covered via a reflective covering, such as a solder mask material, Ag, or other suitable reflector.

In some embodiments, one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (with or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by dispensing, printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cyan LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted significantly by another set of solid state emitters). Aspects of targeting and selectively activating sets of solid state emitters according to the present subject matter may be provided using the circuitry and/or techniques described in commonly assigned and co-pending U.S. patent application Ser. No. 14/221,839, the disclosure of which was previously incorporated hereinabove by reference.

The term "color" in reference to a solid state emitter refers to the color and/or wavelength of light that is emitted by the device upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; U.S. patent application Ser. No. 11/556,440, filed on Dec. 4, 2006; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device. A light-emitting apparatus as used herein can further be used not only for illuminating an object or an area, but also for direct viewing of the apparatus (e.g., LED video displays).

Phosphor and phosphor compounds as disclosed herein can in some aspects comprise one or more of a wide variety of wavelength conversion materials or color conversion components including luminescent materials. Examples of luminescent materials (lumiphors) include phosphors, Cerium-doped Yttrium Aluminum Garnet (YAG) (e.g. LuAG:Ce), Nitrides, Oxy-Nitrides, scintillators, day glow tapes, nanophosphors, quantum dots (e.g., such as provided by NNCrystal US Corp., Fayetteville, Ark.), and inks that glow in the visible spectrum upon illumination with (e.g., ultraviolet) light. Inclusion of lumiphors in wavelength conversion components or related components as disclosed herein, in conjunction with solid state light emitters and LEDs, can be accomplished by providing layers (e.g., coatings) of such materials over solid state emitters and/or by dispersing luminescent materials to a clear encapsulant (e.g., epoxy-based or silicone-based curable resin or other polymeric or ceramic matrix) arranged to cover or partially cover one or more solid state light emitters. One or more luminescent materials useable in devices as described herein may be down-converting or up-converting, or can include a combination of both types.

The use of wavelength conversion materials can provide additional properties and/or features to LED devices including, for example, improved long term reliability (e.g., improved properties beyond 1000 hours or more at 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

The presently disclosed subject matter is directed to embodiments of LED structures having a light source that comprises LEDs. The LED packages can be arranged in different ways and are relatively small, while at the same time are efficient, reliable and cost effective. The embodiments according to the disclosure herein can have different shaped encapsulants, and can emit light with improved or similar efficiency compared to similar LED packages with fully hemispheric encapsulants. In some embodiments where a plurality of LEDs are mounted on a substrate, the spacing between each LED chip can be controlled to optimize the intensity of light output from the LED package. The LED packages according to the disclosure herein can also be smaller and less expensive to manufacture.

The disclosure herein is described with reference to example embodiments, but it is understood that the disclosure herein can be embodied in many different forms and should not be construed as limited to the embodiments set forth herein. In particular, the disclosure herein is described below in regards to certain LED apparatuses having LEDs in different configurations, but it is understood that the disclosure herein can be used for many other LED packages with other LED configurations. LED packages using the disclosure herein can also have many different shapes beyond those described below, such as rectangular, and the solder pads and attach pads can be arranged in many different ways. In other embodiments, the emission intensity of the different types of LEDs can be controlled to vary the overall LED package emission.

The embodiments described herein are with reference to an LED or LEDs, but in accordance with the disclosure herein and in some aspects LEDs as used herein can include LED chips or any other suitable structure or structures. For example, LEDs as used herein can be individual junctions of a monolithic LED. For example, instead of being completely separate LED chips, the LEDs can each be a LED region all on a common substrate that can have different types of monolithic junctions. A gap between the LEDs and on the common substrate can extend to certain layers or can extend all the way to or from the common substrate. Therefore, a monolithic LED can comprise more than one LED junctions on a common substrate, and the gaps between the LEDs can be formed to at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In some embodiments LEDs can be phosphor-converted red or green. In multiple LED packages, the LEDs can be serially interconnected or can be interconnected in different serial and parallel combinations.

Coatings, encapsulants, encapsulant layers, and the like are disclosed herein and can comprise any material that provides mechanical, chemical, and/or environmental protection to a substrate, reflective layer, or other LED component. A coating, encapsulant and/or encapsulant layer can be configured in some embodiments as a layer that covers a substantially horizontal or vertical surface, and in some aspects can comprise a layer disposed on top of another layer, surface or structure whether or not it fully surrounds all sides of the other layer, surface or structure. In some embodiments a coating, encapsulant and/or encapsulant layer can comprise or consist of a dielectric as disclosed herein. It is also understood that when a feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Coating materials disclosed herein can in some aspects comprise a number of encapsulating layers, coatings and/or dielectric materials and compounds, including for example silicon oxide, silicon nitride, aluminum oxide, titanium dioxide, non-metallic oxides, non-metallic nitrides, tantalum oxide, aluminum, nickel, titanium, tungsten, platinum, combinations thereof or alloys thereof, etc. In some aspects such encapsulants, coatings and/or dielectrics can comprise one or more materials arranged to provide desired electrical isolation and high thermal conductivity. For example, a dielectric can provide a desired electrical isolation between electrical traces and/or sets of solid state emitters. In some aspects, such substrates can comprise ceramic such as alumina ($Al_2O_3$), aluminum nitride (AlN), silicon carbide (SiC), silicon, or a plastic or polymeric material such as polyimide, polyester, metal, etc.

In some cases it is desirable to increase the speed of manufacturing LED devices. One approach to increasing speed of manufacture is to assemble many components on a single substrate (or "superstate" as described below) and later separate the groups into component arrays. This can be particularly useful when creating multi-color component arrays for use in high-density (HD) video displays. Multiple arrays can be created as a large sheet and subsequently singulated into individual arrays comprising a plurality of LED devices for each singulated portion.

Additionally, the elimination of parts can streamline the manufacturing process and improve light quality. For example, LED devices can be assembled without the use of, or devoid of, a substrate. This can be accomplished by assembling the LEDs topside down, such that the LED is assembled on a transparent "superstrate" or top-side light transmissive layer, which will become an outer surface in the finished product. The components can then be electrically connected through exposed electrical connection points on the opposite side of the LEDs. The device or apparatus therefore does not have (or is devoid of) a traditional "substrate" on the side of the LEDs opposite the light-transmitting side, such as, for example, a ceramic, metal, or other type of material substrate upon which LEDS are often attached. An LED device built from the "topside down" as described herein can be considered a complete LED device, which is devoid of such a substrate. That is not to say that said LED device cannot later be assembled into a larger (e.g., multiple component) device, which can, for example, include a substrate.

Referring to FIG. 1, an example embodiment of an LED device is shown. A light emitting diode (LED) device, generally designated 100, is depicted in a typical assembly orientation (i.e., with the emitting surface in an upward direction). However, the construction of LED device 100 can occur from the top surface downward. LED device 100 begins with a superstrate, light-transmissive layer 110, which has an outer surface 112 and a component-side surface 114. Light-transmissive layer 110 can be made from any suitable light-transmissive material, for example such as glass, sapphire, epoxy, silicone. Light-transmissive layer 110 can optionally have features for altering the light emission characteristics of LED device 100, which are described in more detail below.

Adjacent to and under light-transmissive layer 110 is a die-attach layer 120. Die-attach layer can be the same material as light-transmissive layer 110 when suitable, or it can be a different, compatible material. For example, in some embodiments both light-transmissive layer 110 and die-attach layer 120 can be an epoxy or silicone material, with light-transmissive layer 110 being provided in a substantially fully cured state at assembly, while die-attach layer 120 is provided in an uncured, viscous, and/or adhesive state and subsequently cured. Die-attach layer 120 can be applied on an entire surface of light-transmissive layer 110 (as shown in FIG. 1), or die-attach layer 120 can be applied to selected areas of light-transmissive layer 110.

LED components 130 are then placed onto die-attach layer 120 such that a light-emitting surface 132 is in contact with die-attach layer 120. LED components 130 can be grouped as an array and can include multiple colors, such as red, green, and blue (RGB) LEDs. In some such embodiments, the LED components 130 are grouped into red-green-blue arrays for use in video displays. Placing LED components 130 directly onto adhesive die-attach layer 120 rather than on a traditional substrate advantageously allows the transfer of large numbers of LEDs at once. This can greatly improve processing speed, which is particularly useful when assembling mini- or micro-LEDs. Although it is not standardized, mini-LEDs are generally described as approximately 90-250 micrometers (µm) in size, while micro-LEDs are usually considered to be 10-90 µm in size. This method can also simplify placement of multi-colored LEDs. For example, all LEDs of a first color can be placed in a single group, followed by mass placement of a second and third color.

In some embodiments, die-attach layer 120 can be interspersed or layered with additional optics layers (not shown). For example, an optics layer can comprise light-diffusing or wavelength-converting materials. An optics layer can be applied, for example, in a selected area between the superstrate (e.g., light-transmissive layer 110) and top surface of LED component 130. In other embodiments, the superstrate itself can be modified to incorporate light-diffusing or wavelength-conversion (e.g., phosphor) materials and/or color-filtering materials in selected areas.

It is additionally noted that LED components 130 can refer to any LED chips commonly used in the art, including the LED semiconductor active layers making up the diode itself with ohmic contacts which are typically metallized and presented on a surface for the purpose of electrical and/or mechanical attachment; passivation layers required for protection of the semiconductor and other underlying layers; and optionally a substrate of its own, such as sapphire, silicon carbide, or silicon.

After LED components 130 are adhered to die-attach layer 120, an encapsulant layer 140 is applied around and between LED components 130. Encapsulant layer 140 can be applied by any coating or dispensing approach as described herein or otherwise known in the art, such as dispensing, molding, stenciling, screen printing, spinning, spraying, powder-coating, slit coating, etc. Encapsulant layer 140, can comprise one or more of epoxy, epoxy-polyester hybrid, aliphatic urethane, TGIC polyester, non-TGIC polyester, silicone, silicone-modified polyester, silicone hybrid, silicone-epoxy hybrid, acrylic, polycarbonate, or any suitable combinations thereof. Encapsulant layer 140 can be used to control the light output of LED device 100. For example, encapsulant layer 140 can be an electrically insulating and a non-reflective or opaque material, such as a white, grey, dark, or black material. For the purposes of the disclosure herein, a non-reflective material is defined as a material or surface that does not reflect or redirect the majority of light impinging upon it. Black encapsulants can be preferable, for example, in one-sided video displays. Alternately, encapsulant layer 140 can be a clear material, which can be used, for example, in two-sided video displays or transparent displays such as "heads-up" displays. Encapsulant layer 140 can be particularly useful for controlling light output in the far field. Encapsulant layer 140 can further include multiple layers comprising the same or different materials and/or colors. For example, encapsulant layer 140 can be formed of a first white layer followed by a black layer.

LED components 130 are additionally provided with one or more electrically conductive elements 134, such as metal "bumps" or pads on a side of each LED component 130 away from die-attach layer 120. These conductive elements 134 can be applied in a variety of conventional methods, such as wire bump bonding, solder bumping, plating, or other metallization techniques. Conductive elements 134 are, in the embodiment shown, electrically connected by applying one or more layers of electrically-conductive (typically metal) traces 150 over the conductive elements 134. Also shown in FIG. 1 is solder mask 160 (optional), which is disposed at least partially over the one or more layers of traces 150. In some embodiments, the solder mask 160 may be applied to outermost traces of multiple layers of traces 150.

In some embodiments, it is advantageous to provide electrically conductive elements 134 on the surface of LED components 130 before encapsulant layer(s) 140 are applied. Then encapsulant layer 140 can be applied on all bottom surfaces, after which the whole surface can be planarized by any method, such as grinding, lapping, etc., forming surface S.

Figure 2A:
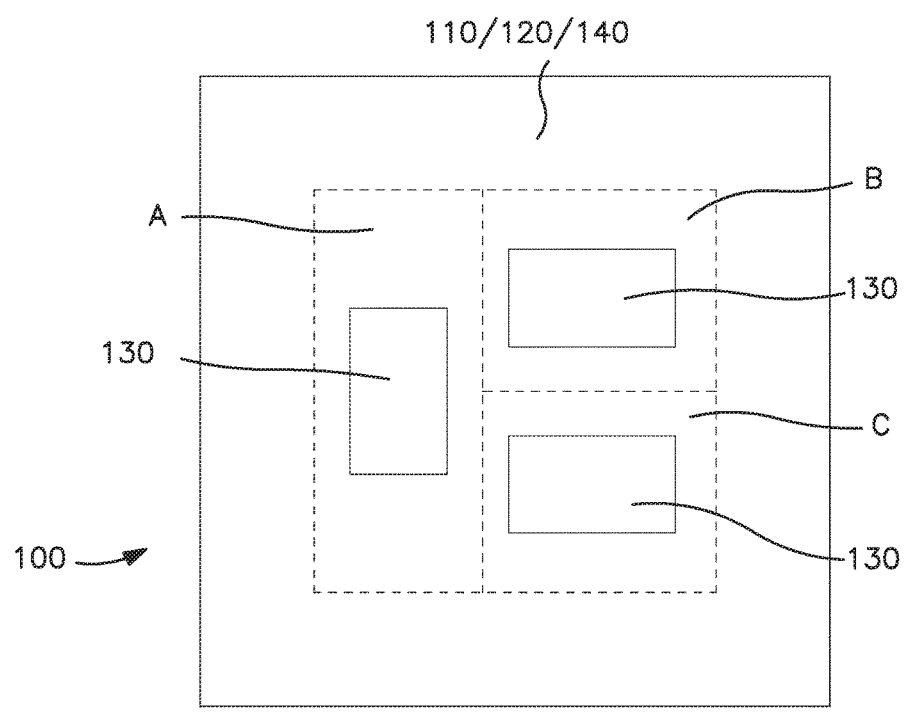
FIG. 2A is a top view of an LED apparatus according to the disclosure herein.

FIG. 2A depicts a schematic drawing of a top view of LED device 100 illustrating example regions for light transmittal. In some embodiments, light extraction features, also known as optical elements, (e.g., 110 and 116 described below) can be disposed only on specific, localized areas of LED device 100. For example, the areas located above LEDs 130 can be considered as optical element regions A, B, and C. These regions are also seen in profile in FIG. 1. In some embodiments, light-transmissive layer 110 can be disposed over only one LED 130 (i.e., region A, or region B, or region C). In other embodiments, optical elements can be disposed over any two regions A, B, and C. In yet other embodiments, optical elements can be disposed over all three regions but without extending over the entire surface of LED 100. The features of light-transmissive layer 110 can vary between regions, having different depths, shapes, etc. Multiple optical elements can further be combined, such as adding a surface texturization 116, described in further detail below.

Figure 2B:
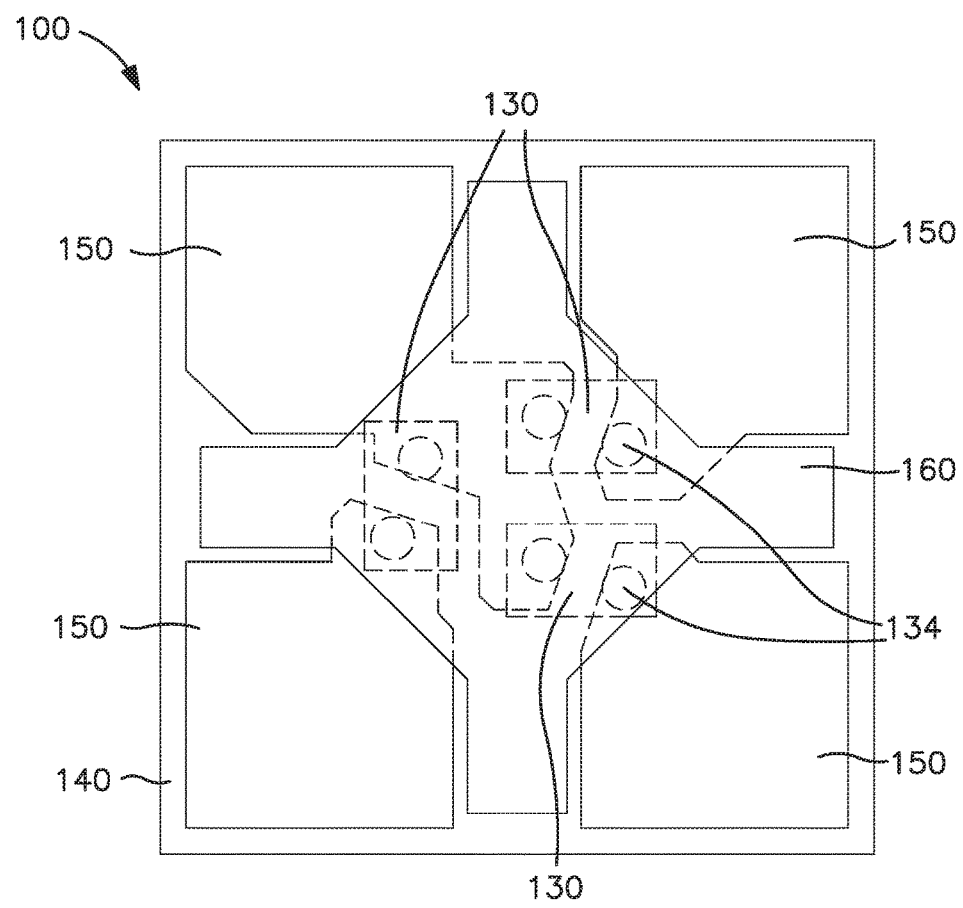
FIG. 2B is a bottom view of an LED apparatus according to the disclosure herein.

Referring to FIG. 2B, LED device 100 is viewed schematically from a bottom orientation (i.e., opposite the light emitting surface), showing more detail of traces 150 and solder mask 160. In the embodiment shown, traces 150 electrically connect to conductive elements 134 in an array of LED components 130 and extend beyond the boundaries of LED components 130 to provide attachment points for external circuitry. For example, traces 150 can be used to mount LED device 100 on a substrate or printed circuit board (PCB). In some embodiments, multiple layers of electrical traces can be constructed on the lower surface of LED device 100, to add more functionality or to avoid the need for a circuit board. This is described in more detail below.

Figure 3A:
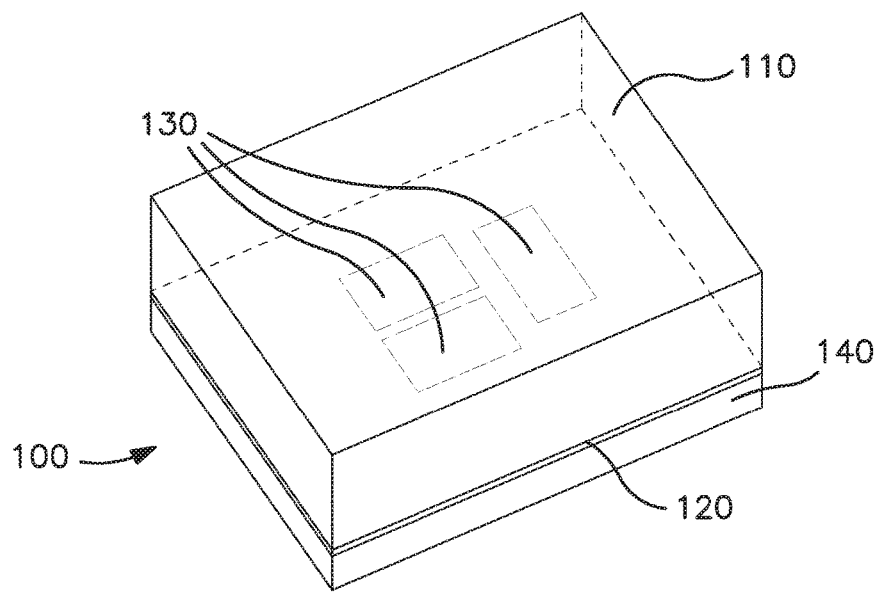
FIG. 3A is an isometric top view of an LED apparatus according to the disclosure herein.
Figure 3B:
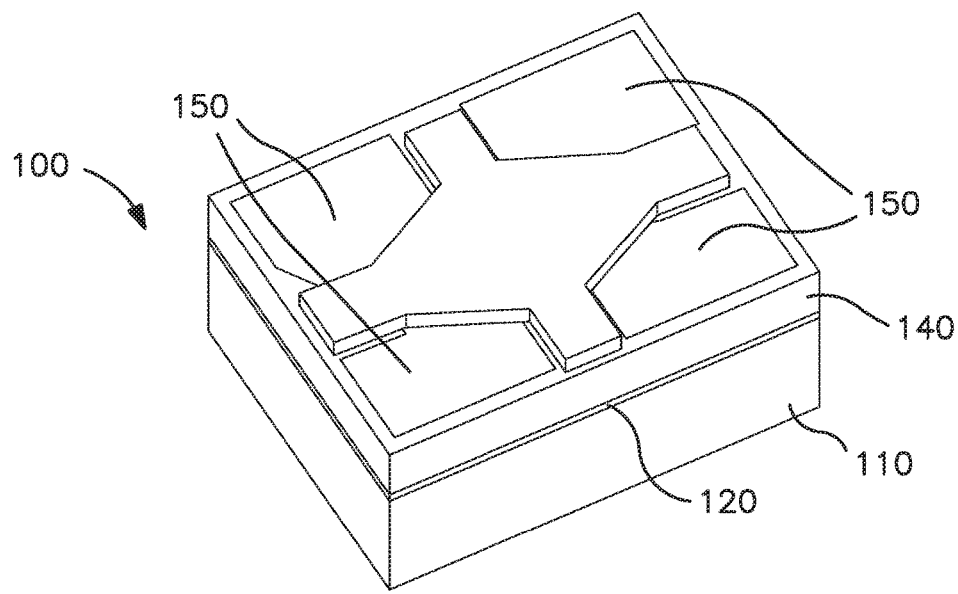
FIG. 3B is an isometric bottom view of an LED apparatus according to the disclosure herein.

FIGS. 3A-3B show isometric views of a finished LED device 100. FIG. 3A is a top view, where LED components 130 can be seen through light-transmissive layer 110 and die-attach layer 120. Encapsulant layer 140 extends around the lower portion of LED device 100. In this example embodiment, encapsulant layer 140 is a black encapsulant layer. FIG. 3B is a bottom view showing traces 150 and solder mask 160 disposed on a bottom surface of the LEDs opposite the die-attach layer 120. Solder mask 160 can be used, for example, to prevent shorting when soldering LED device 100 to a PCB.

Figure 4:
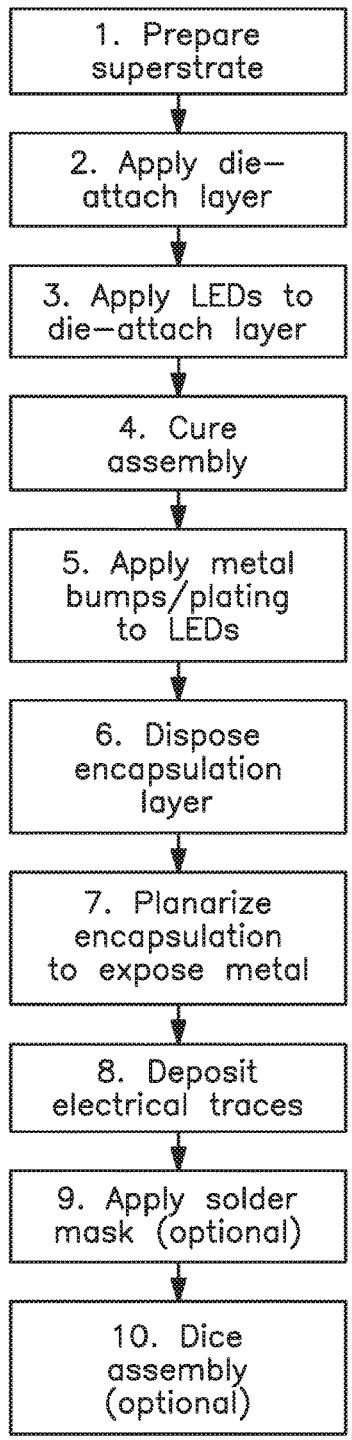
FIG. 4 is a flow chart of a method of producing an LED apparatus according to the disclosure herein.

A corresponding example method of producing an LED device (e.g., LED device 100) is illustrated in FIG. 4. First, a light-transmissive "superstate" (e.g., light-transmissive layer 110) is prepared (Step 1). The superstrate can be prepared with either a smooth or a textured outer surface, as described above. The light-transmissive layer can be clear, or there may be added diffusers or other wavelength-conversion materials (e.g., "optics layers" as previously described). Next (Step 2), a die-attach layer (e.g., die-attach layer 120) is applied to the superstrate. For example, the die-attach layer can be a light-transmitting epoxy or silicone die attach adhesive.

LEDs (e.g., LED components 130) are then pressed into the die-attach layer (Step 3) such that the light-emitting surface is in contact with the die-attach layer, and the die-attach layer is then cured (Step 4). The LEDs can be applied to the die-attach layer by a variety of known methods, including pick-and-place or direct tape transfer. The LEDs can be, for example, transferred en masse from a tape, where the tape is subsequently removed and the die-attach surface is cleaned and prepared for the next step. Once the die-attach layer is cured, the LEDs can have conductive elements (e.g., metal bumps) applied to the exposed electrical connections. Optionally, the LEDs can be plated using direct metallization (Step 5). Alternately, the LEDs can be pre-bumped before attaching to the die-attach layer or have thick metal layers applied at the wafer level.

At this point, the LEDs are fixed securely to the superstrate by their light-transmitting surface, and the volume of the LEDs is exposed. An encapsulant layer is then applied over the LEDs (Step 6). The encapsulant layer can be applied such that it entirely covers all of the exposed surfaces the LEDs, including the electrical connections and/or metal bumps. After curing, a thin layer of the encapsulant layer is then removed as necessary to reveal the metal connection points and planarize the surface (Step 7). Removal, or planarization, of the encapsulation can be accomplished by, for example, lapping, buffing, grinding, or sanding. Next, electrical traces (e.g., 150) are applied to the metal bumps by any suitable, conventional circuit laying methods (Step 8). After depositing the metal traces, a layer of solder mask can optionally be applied (Step 9) according to design requirements. This can be accomplished, for example, by a screen-print method or using a photo-imagable solder mask. The sheet of transmissive material can then be post-processed by separating (e.g., by dicing) the LED apparatus multiple portions, each of which comprises a plurality of LEDs which can be configured as individual LED arrays (Step 10). The diced components can then be further sorted and prepared for installation into larger LED devices.

Figure 5:
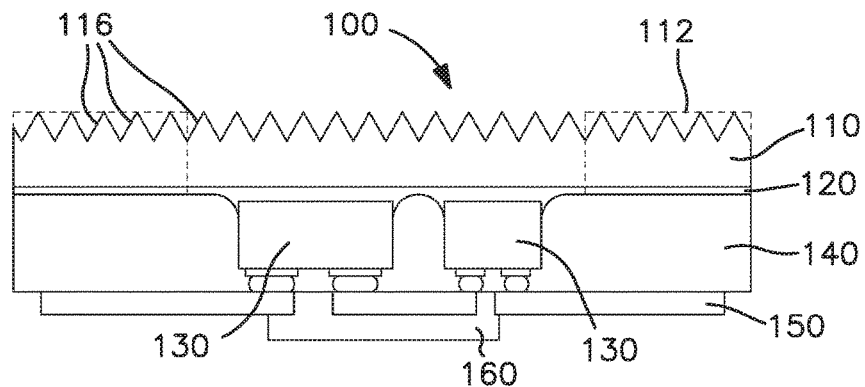
FIG. 5 is a cross-sectional side view of another LED apparatus according to the disclosure herein.

As previously mentioned, an LED device as disclosed herein can also have additional, optional features to affect the light output and particularly to improve far-field viewing. For example, the superstrate can be treated to create a surface texturization. FIG. 5 depicts LED device 100 with an example surface texturization 116 on outer surface 112 of light-transmissive layer 110. Texturization 116 can be either pre-formed on light-transmissive layer 110, or it can be formed during or after manufacture of the LED device 100. For example, texturization 116 can be imprinted into light-transmissive layer 110 as it is formed during the forming process of the light-transmissive layer 110, or it can be created at a later point in the process (e.g., see FIG. 4), using conventional methods such as cutting, molding, embossing, or etching. Material can be added, removed, or reformed. Texturization 116 can be the same material as light-transmissive layer 110, or it can be a different material. One method of producing texturization 116, for example, is to form light-transmissive layer 110 on a ceramic master. The ceramic material can have natural surface variations which produce a pattern of texturization 116. In this case the surface variations can be considered random or natural. Alternately, the variations can also be prescribed, such as, for example, in a regular, repeated, predetermined, or designed pattern. The pattern of texturization 116 can be adapted to achieve various effects, and it can be either a prescribed (which also can be referred to as regular) grid pattern, which acts as a lens, or a random pattern. The pattern is, in some aspects, a microstructure pattern having, for example, a size on the order of a microstructure, (e.g., 1-100 μm). In some embodiments having the microstructure pattern for surface texturization 116, the microstructure pattern is located on outer surface 112 of light-transmissive layer 110 in a prescribed (which also can be referred to as regular) or random pattern. Texturization 116 can be consistent over the entire outer surface of the superstrate, or it can be applied in a targeted region, as described with regards to FIG. 2A. For example, texturization 116 can have features aligned with an LED 130 (e.g., regions, A, B, and or C). Some LEDs 130 can have a different feature over or beside them than others. Different regions A, B, and C can have the same or different texturizations 116, which can vary in size, height, shape, location, etc. It is also envisioned that the microstructure can be non-patterned in whole or partially.

There are several advantages to producing an LED device (e.g., 100) without a, or devoid of a, substrate and with a surrounding encapsulant. With this method it is possible to rapidly produce either individual multi-color arrays of LEDs, or larger matrices of LEDs. Adhering the LEDs to an epoxy die-attach layer provides a robust mechanical design and is compatible with rapid processing methods such as mass transfer. Additionally, the devices can be thinner and have a lower cost than conventional LED devices that are produced on a substrate. This allows increased packaging density. The use of an encapsulant, particularly a dark or black encapsulant, can improve far-field light consistency and effective contrast under ambient light. Furthermore, the electrical connections to the LED die can be made en-mass with standard wafer or PCB board-level processing.

Figure 6:
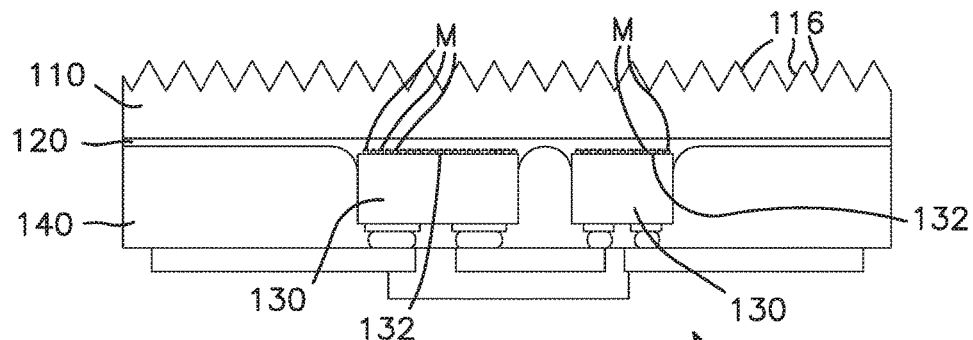
FIG. 6 is a cross-sectional side view of another LED apparatus according to the disclosure herein.

Referring to FIG. 6, the LED components 130 can also have features applied to the light-emitting surfaces 132 to alter light output. In some embodiments, in addition to, or in place of, a microstructure pattern or texturization, a pattern element may be provided on a surface of one or more LED components 130 adjacent to the die-attach layer 120. This can be accomplished at the LED wafer level by adding layers to the back side, or by creating a pattern with a removal process such as those commonly used on sapphire substrates prior to epi growth. This can be in the form of material M deposited on light-emitting surface 132. Material M is a patterned material and can include, for example, sapphire, metal, organic, or inorganic materials. Material M can be applied selectively to individual LED components 130 in an array, or to all LED components 130 in an array. Additionally, material M can be deposited in a pattern designed to achieve a particular effect, such as reshaping or scattering the light. This can also be useful in improving far field light quality.

Figure 7:
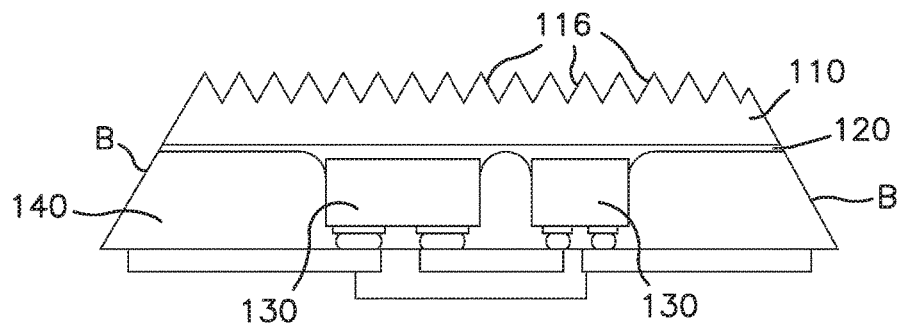
FIG. 7 is a cross-sectional side view of another LED apparatus according to the disclosure herein.

In another embodiment, LED device 100 can include shaped edges that can for example be curved edges or as shown in FIG. 7 beveled edges B. Beveled edges B can affect the light output pattern and can help make LED device 100 more robust against external forces, which may occur in an assembly. It is to be understood that the features of FIGS. 5-7 can be used individually or in any combination.

Figure 8:
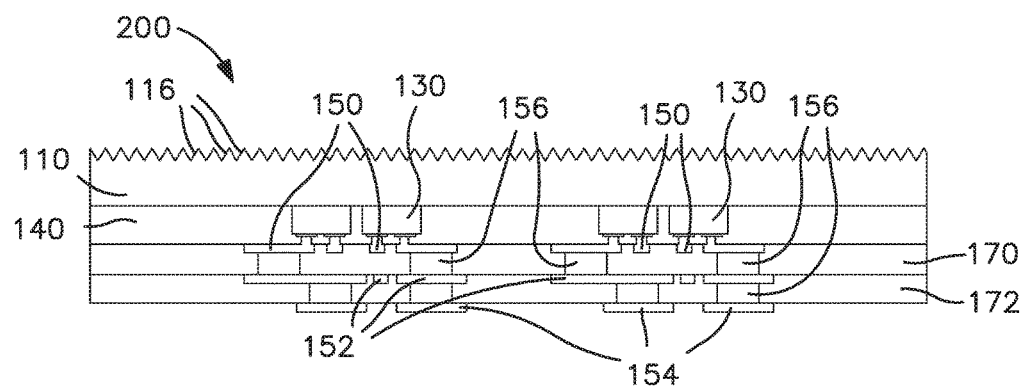
FIG. 8 is a cross-sectional side view of another LED apparatus according to the disclosure herein.

FIG. 8 depicts another embodiment of an LED device, generally designated 200. LED device 200 is constructed in the same manner as LED device 100, by disposing LED components 130 on a superstrate. (For simplicity, die-attach layer 120 is not shown.) After depositing electrically conductive traces 150, an insulating layer 170 is added. Further electrical traces, e.g., 152, 154 can then be successively added as needed according to the particular design requirements. Electrical traces 152, 154 are separated by an insulating layer 172 and are connected to one another and to traces 150 by conducting vias 156. LED device 200 can have any number of alternating electrical and insulating layers to meet the design requirements and can also include ground plane and power plane layers. This construction introduces the ability to form more complex circuitry than would otherwise be possible by allowing wires to cross one another in different layers (e.g., to allow for a three-dimensionally wired circuit). LED device 200 therefore comprises a multilayer construction and can also advantageously be populated, in some embodiments, with other types of active or passive components (not shown) to provide enhanced functionality for LED device 200.

Figure 9:
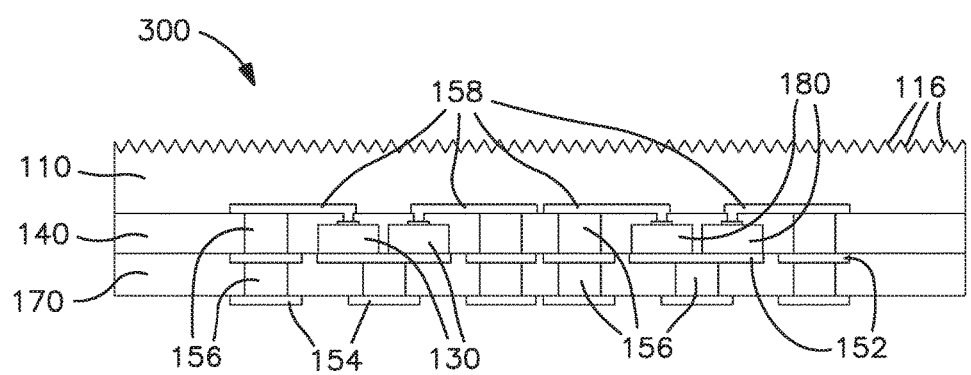
FIG. 9 is a cross-sectional side view of another LED apparatus according to the disclosure herein.

FIG. 9 depicts an alternate embodiment of a multi-layer LED device, generally designated 300. In this embodiment, which is also constructed from a top-down approach, electrical traces 158 are deposited on component-side surface 114 of light-transmissive layer 110 prior to attaching LED components 130. This accommodates the use of LEDs having a vertical die, i.e., having contacts on opposite sides of an LED. Electrically conductive metal traces 158 can be configured to maximize light output, for example, by minimizing the size or employing transparent material, such as indium tin oxide (ITO), for the traces. Additionally, electrical traces 158 can be a combination of transparent material and metal connection points. In other aspects, LED device 300 is similar to LED device 200. After depositing a first layer of electrically conductive metal traces 158, LED components 130 are electrically bonded to electrical traces 158, and encapsulant layer 140 is added. Next, alternating layers of electrical traces (e.g., 152, 154) and insulating layers 170 can then be successively added as needed according to the particular design requirements. To accomplish electrical connection, bumps or thick metal layers may be added to the bottom of LED components 130. For example a thick copper pad can be put an LED component 130 while it is in wafer form. Alternatively, a laser can be used to clear the pad before applying the electrical traces.

Electrical traces 152, 154 are separated by an insulating layer 172 and are connected to one another and to traces 150 by conducting vias 156. This construction introduces the ability to form more complex circuitry than would otherwise be possible by allowing wires to cross one another in different layers (e.g., to allow for a three-dimensionally wired circuit). LED device 300 therefore comprises a multilayer construction and can also advantageously be populated, in some embodiments, with other types of active or passive components (not shown) to provide enhanced functionality for LED device 300. Similarly to LED device 200, LED device 300 can have any number of alternating electrical and insulating layers to meet the design requirements and can also include ground plane and power plane layers. Additionally, it is to be understood that features of LED device 200 and LED device 300 can be combined. For example, some regions of an LED device can have an electrical trace 158 adjacent to the die attach layer 120 to allow LED components 130 to be bonded to the traces (i.e., oriented in a vertical direction), while other regions of the device have LEDs that are adhered to the die attach layer 120 in a horizontal orientation.

Although the embodiments described herein are directed toward multi-color arrays of LEDs, it is to be understood that the methods and devices can also be applied to single LEDs and single-color arrays.

While the subject matter has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Aspects disclosed herein can, for example and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A method of producing a light-emitting diode (LED) apparatus, comprising:
   providing a light-transmissive layer;
   applying a die-attach layer to the light-transmissive layer;
   after applying the die-attach layer to the light-transmissive layer, attaching one or more LED to the die-attach layer;
   applying electrically conductive elements to electrical contact surfaces of the one or more LED;
   after applying the electrically conductive elements, applying an electrically insulating encapsulant layer to the one or more LED; and
   planarizing a portion of the encapsulant layer to expose at least a portion of the electrically conductive elements and/or applying one or more layers of electrical traces over the electrically conductive elements.

2. The method of claim 1, wherein the encapsulant layer comprises an opaque layer formed of a dark, white, and/or black material.

3. The method of claim 1, wherein the encapsulant layer comprises a layer of clear, translucent, and/or diffuse material.

4. The method of claim 1, comprising a plurality of LEDs.

5. The method of claim 4, wherein the plurality of LEDs comprise red-green-blue (RGB) arrays.

6. The method of claim 1, comprising:
   providing a microstructure pattern on an outer surface of the light-transmissive layer; and/or
   applying a patterned material on a light-emitting surface of one or more LEDs adjacent to the die-attach layer.

7. The method of claim 1, comprising applying a solder mask to at least a portion of outermost electrical traces of the one or more layers of electrical traces.

8. The method of claim 1, further comprising applying a first electrical trace between the light-transmissive layer and the one or more LED.

9. A light emitting diode (LED) apparatus, comprising:
   a light-transmissive layer;
   a die-attach layer disposed on the light-transmissive layer; and
   one or more LED disposed on the die-attach layer;
   wherein the LED apparatus is devoid of a substrate, and
   wherein the one or more LED is disposed on the die-attach layer such that a light-transmitting surface of the one or more LED is in contact with the die-attach layer,
   wherein the light-transmissive layer comprises a microstructure design on an outer surface of the light-transmissive layer.

10. The LED apparatus of claim 9, further comprising an encapsulant layer disposed around and between the one or more LED, wherein the encapsulant layer comprises an electrically-insulating material.

11. The LED apparatus of claim 10, wherein the encapsulant layer comprises an opaque layer formed of a dark, white, or black material.

12. The LED apparatus of claim 9, wherein one or more side surfaces of the LED apparatus are beveled.

13. The LED apparatus of claim 9, wherein the microstructure is patterned, and the pattern is aligned with the one or more LED.

14. The LED apparatus of claim 9, comprising a red-green-blue (RGB) color array.

15. The LED apparatus of claim 9, comprising one or more layers of electrical traces disposed on a bottom surface of the one or more LED, opposite the die-attach layer.

16. A light emitting diode (LED) apparatus, comprising:
    a light-transmissive layer;
    a die-attach layer disposed on the light-transmissive layer;
    one or more LED disposed on the die-attach layer;
    one or more layers of electrical traces disposed on a bottom surface of the one or more LED, opposite the die-attach layer; and
    an electrically conductive element interposed between the one or more LED and a first layer of electrical traces.

17. The LED apparatus of claim 16, comprising a solder mask disposed on at least one of the one or more layers of electrical traces.

18. The LED apparatus of claim 16, wherein the one or more layers of electrical traces comprise multiple layers of electrical traces, which are interconnected across insulating layers by electrically conductive vias.

19. The LED apparatus of claim 9, comprising non-LED electronic components.

20. The LED apparatus of claim 9, wherein at least one of the one or more LED comprises a material applied on the light-emitting surface thereof, and wherein the material is disposed in a prescribed or random pattern formed by one or more of sapphire, metal, organic material, and inorganic material.

21. A substrate-free light emitting diode (LED) apparatus, comprising:
    a light-transmissive layer;
    a die-attach layer disposed on the light-transmissive layer;

one or more LED disposed on the die-attach layer such that a light-transmitting surface of the one or more LED is in contact with the die-attach layer;

an opaque encapsulant layer disposed around and between the LED;

a layer of electrical traces disposed on a bottom surface of the one or more LED, opposite the die-attach layer; and a solder mask disposed over at least a portion of the layer of metal traces.

* * * * *